United States Patent
Hamada et al.

(10) Patent No.: US 6,380,049 B1
(45) Date of Patent: Apr. 30, 2002

(54) SEMICONDUCTOR SUBSTRATE AND METHOD OF MANUFACTURING SEMICONDUCTOR DEVICE

(75) Inventors: Takehiko Hamada; Masayuki Hamada, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/610,403

(22) Filed: Jul. 5, 2000

Related U.S. Application Data

(62) Division of application No. 09/009,051, filed on Jan. 20, 1998, now Pat. No. 6,133,641.

(30) Foreign Application Priority Data

Jan. 23, 1997 (JP) .............................................. 9-010653

(51) Int. Cl.[7] .......................... H01L 21/46; H01L 21/78; H01L 23/544
(52) U.S. Cl. ...................... 438/462; 257/797; 438/401; 438/975
(58) Field of Search .......................... 257/797; 438/401, 438/462, 975

(56) References Cited

U.S. PATENT DOCUMENTS

| | | | |
|---|---|---|---|
| 5,002,902 A | 3/1991 | Watanabe | |
| 5,308,682 A | 5/1994 | Morikawa | |
| 5,580,829 A | * 12/1996 | Browning et al. | .......... 438/480 |
| 5,614,767 A | 3/1997 | Ohara | |
| 5,684,333 A | 11/1997 | Moriyama | |
| 5,933,744 A | 8/1999 | Chen et al. | |
| 5,946,583 A | * 8/1999 | Wu | ............................ 438/401 |

FOREIGN PATENT DOCUMENTS

| | | |
|---|---|---|
| JP | 2172215 | 7/1990 |
| JP | 2229419 | 9/1990 |

* cited by examiner

*Primary Examiner*—Allan R. Wilson
(74) *Attorney, Agent, or Firm*—Rosenman & Colin LLP

(57) ABSTRACT

A method of manufacturing a semiconductor device, in which a contact alignment mark (18A) is formed in an interlayer insulating film (17), and a wiring alignment mark (19A) is formed above a gate alignment mark (15A) so that the size of the wiring alignment mark (19A) is slightly larger than the gate alignment mark (15A). At the same time, all the other alignment marks at the lower side are shielded by a shield film (19S). Opaque alignment mark and opaque shield film are formed to shield all the alignment marks at the lower side, whereby the alignment marks can be successively formed while stacked on one another.

6 Claims, 7 Drawing Sheets

F I G. 9A
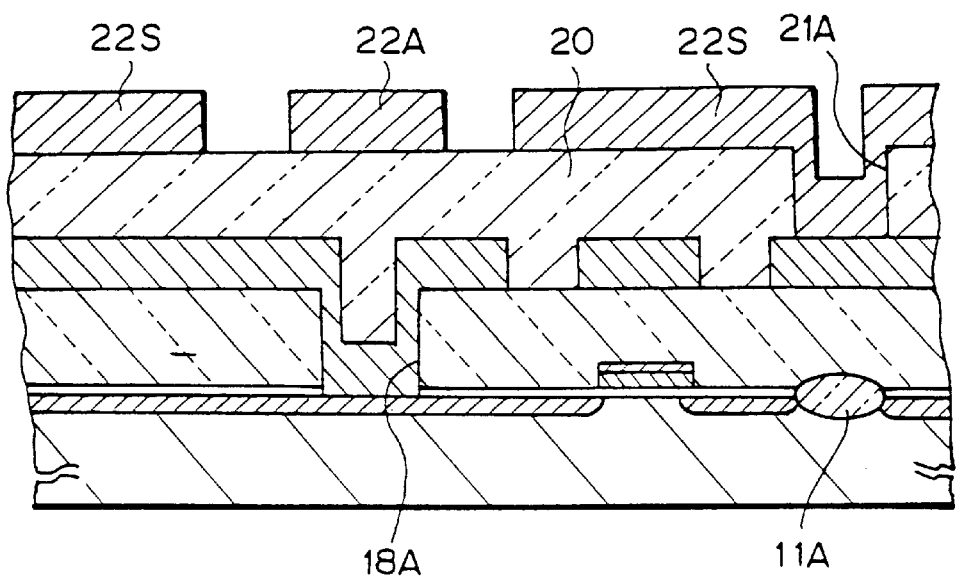
F I G. 9B
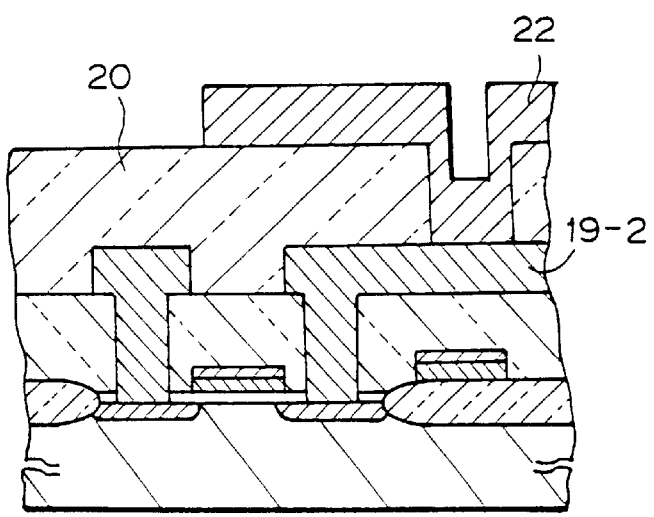

SEMICONDUCTOR SUBSTRATE AND METHOD OF MANUFACTURING SEMICONDUCTOR DEVICE

This application is a divisional application of U.S. application Ser. No. 09/009,051 filed on Jan. 20, 1998 now U.S. Pat. No. 6,133,641.

BACKGROUND OF THE INVENTION

1. Field of the Invention

The present invention relates to a semiconductor substrate and a method of manufacturing a semiconductor device, and particularly to those characterized in an alignment mark for positioning a mask and a method of forming the alignment mark.

2. Description of the Related Art

A process of manufacturing a semiconductor device contains a step of transferring a pattern formed on a mask onto a semiconductor wafer. In this case, as shown in FIG. 1A, a predetermined pattern is transferred onto a chip region 2 on a semiconductor wafer 1 to form a layer which comprises the semiconductor device, and at the same time a field alignment mark $(X_1, Y_1)$, for example, is transferred onto scribe areas 3X, 3Y on the semiconductor wafer 1. Such an alignment mark comprises plural basic marks M which are regularly arranged as shown in FIG. 1B. Thereafter, a pattern transfer operation is performed in a next step on the basis of the field alignment mark $(X_1, Y_1)$. The alignment marks $(X_2, Y_2)$, $(X_3, Y_3)$, . . . for use in the respective steps are successively formed while displacing the position. This is because the respective alignment marks are prevented from being overlapped with one another and thus it is avoided that the alignment marks are identifiable.

Followed by the microstructure and multilayer structure of wires of semiconductor devices, a technique of flattening an interlayer insulating film at the lower side of a wiring layer to facilitate the processing of fine wires (microstructure wires) has been increasingly more important. However, the flattening of the interlayer insulating film makes such a disadvantage that it is difficult to see an alignment mark of a substrate for positioning a mask, particularly an alignment mark which is formed by using unevenness of the insulating film. Therefore, the alignment mark is needed to be formed in a step just before the wiring layer is formed, so that the number of alignment marks is increased and an area of the scribe region is also increased.

As a method of solving this problem, Japanese Patent Application Laid-open No. Hei-2-229419 discloses a method (prior art) of forming an alignment mark as shown in FIG. 2. This method will be hereunder described.

In a first mask step, a first pattern is formed on a chip region of a silicon substrate (wafer), and at the same time an alignment mark 4a is formed on a scribe region of the silicon substrate 1 (wafer). In a second mask step, a mask is positioned to the alignment mark 4a to form a second pattern on the chip region and at the same time an alignment mark 4b is formed.

After the second pattern is formed, a flattening layer 7 and an interlayer insulating film 5 are formed. When a third pattern forming layer 6 formed on the interlayer insulating film 5 is made of an opaque material such as aluminum or the like, an alignment mark 4c is formed on the interlayer insulating film 5 on the basis of the alignment mark 4b before the opaque film 6 is formed. The alignment mark 4c is formed at the same position as the alignment mark 4a while overlapped with the alignment mark 4a.

Before the opaque film 6 is formed, the two alignment marks 4a and 4c are detected at the same time. However, after the opaque film 6 is formed, the alignment mark 4a is unseen, and thus it does not act as an obstacle to position the mask to the alignment mark 4c. The alignment marks are formed at the same position in superposition with each other, and this arrangement reduces the occupation area of the alignment marks on the wafer.

According to the technique described in Japanese Patent Application Laid-open No. Hei-2-229419, the alignment mark 4c for use when the opaque film 6 is patterned can be formed at the same position as the alignment mark 4a. However, in this publication, no description is made on the case where an additional interlayer insulating film is further formed, a contact hole is formed therein and a wiring layer serving as an upper layer is then formed. Further, this publication makes no clear description as to whether the opaque film 6 is left on a scribe region or removed therefrom when the opaque film 6 on the chip region is patterned. When an alignment mark is formed on the scribe region by patterning the opaque film 6, it is estimated that it is formed at a position where the alignment marks 4a, 4b, 4c are not formed. Accordingly, when a semiconductor device having a multilayered wiring structure is manufactured, the reduction of the occupation area of the alignment marks on the scribe region is not sufficient.

In the above description, a pair of alignment marks are formed in a single step. However, actually, plural alignment marks are formed on the scribe regions 3X, 3Y in many cases.

SUMMARY OF THE INVENTION

Therefore, an object of the present invention is to provide a semiconductor substrate and a method of manufacturing a semiconductor device which can further reduce the occupation area of the alignment marks.

In order to attain the above object, a semiconductor substrate according to the present invention has a first alignment mark formed on a scribe area, a first interlayer insulating film formed on the first alignment mark, and a second alignment mark comprising an opaque film which selectively covers the first interlayer insulating film and is provided above the first alignment mark, wherein the first alignment mark is shielded by the second alignment mark. The scribe area isolates each chip region from the others.

In this case, the surface of the first interlayer insulating film may be flattened.

Further, a shield film may be formed simultaneously with the opaque film constituting the second alignment mark so as to be away from the second alignment mark at a predetermined distance. Still further, there may be provided a second interlayer insulating film for covering the second alignment mark and a third alignment mark comprising said second interlayer insulating film. The third alignment mark being located on the shield film is formed, for example, by removing the second interlayer insulating film on the shield film. In this case, the surface of the second interlayer insulating film may be flattened.

In the above semiconductor substrate, the first alignment mark comprises plural first basic marks which are arranged regularly, and the second alignment mark comprises plural second basic marks which are arranged regularly and each of which is larger in size than each first basic mark by at least an amount enough for positioning, the first and second basic marks being arranged so that each of the second basic marks is located on each of the first basic marks.

A semiconductor device manufacturing method according to the present invention comprises a step of forming a first alignment mark on a scribe area, forming a first interlayer insulating film, and forming an interlayer alignment mark by patterning the first interlayer insulating film, and a step of depositing and patterning a conductive opaque film to form a second alignment mark shielding the first alignment mark. A semiconductor device is manufactured in a chip region of a semiconductor substrate having the above scribe area for isolating said chip region from the others.

In this case, the method may further comprise a step of flattening the surface of the first interlayer insulating film.

Further, a shielding film which is made of a conductive opaque film may be formed so as to be away from the second alignment mark at a predetermined distance. The method may further comprise a step of forming a second interlayer insulating film so as to cover the second alignment mark, and selectively removing the second interlayer insulating film to form a third alignment mark on the shield film. In this case, the method may contain a step of flattening the surface of the second interlayer insulating film.

In the semiconductor device manufacturing method as described above, the first alignment mark may be formed by regularly arranging plural first basic marks, and second basic marks each of which is larger in size than each first basic mark by at least an amount enough for positioning may be arranged one by one above each first basic mark to form the second alignment mark.

Since the first alignment mark serving as the lower layer alignment mark is shielded by the second alignment mark comprising the opaque film, the first alignment mark does not act as an obstacle to the positioning of the mask on the basis of the second alignment mark.

According to the present invention, a plurality of various alignment marks can be formed while stacked on one another, and thus the occupation area of the alignment forming region can be further reduced, so that the saving of the resources and the reduction of the cost of the semiconductor devices can be achieved.

BRIEF DESCRIPTION OF THE DRAWINGS

FIGS. 9A and 9B are cross-sectional views showing the scribe area and the chip region.

DETAILED DESCRIPTION OF PREFERRED EMBODIMENT

A preferred embodiment according to the present invention will be described hereunder with reference to the accompanying-drawings.

Figure 3:
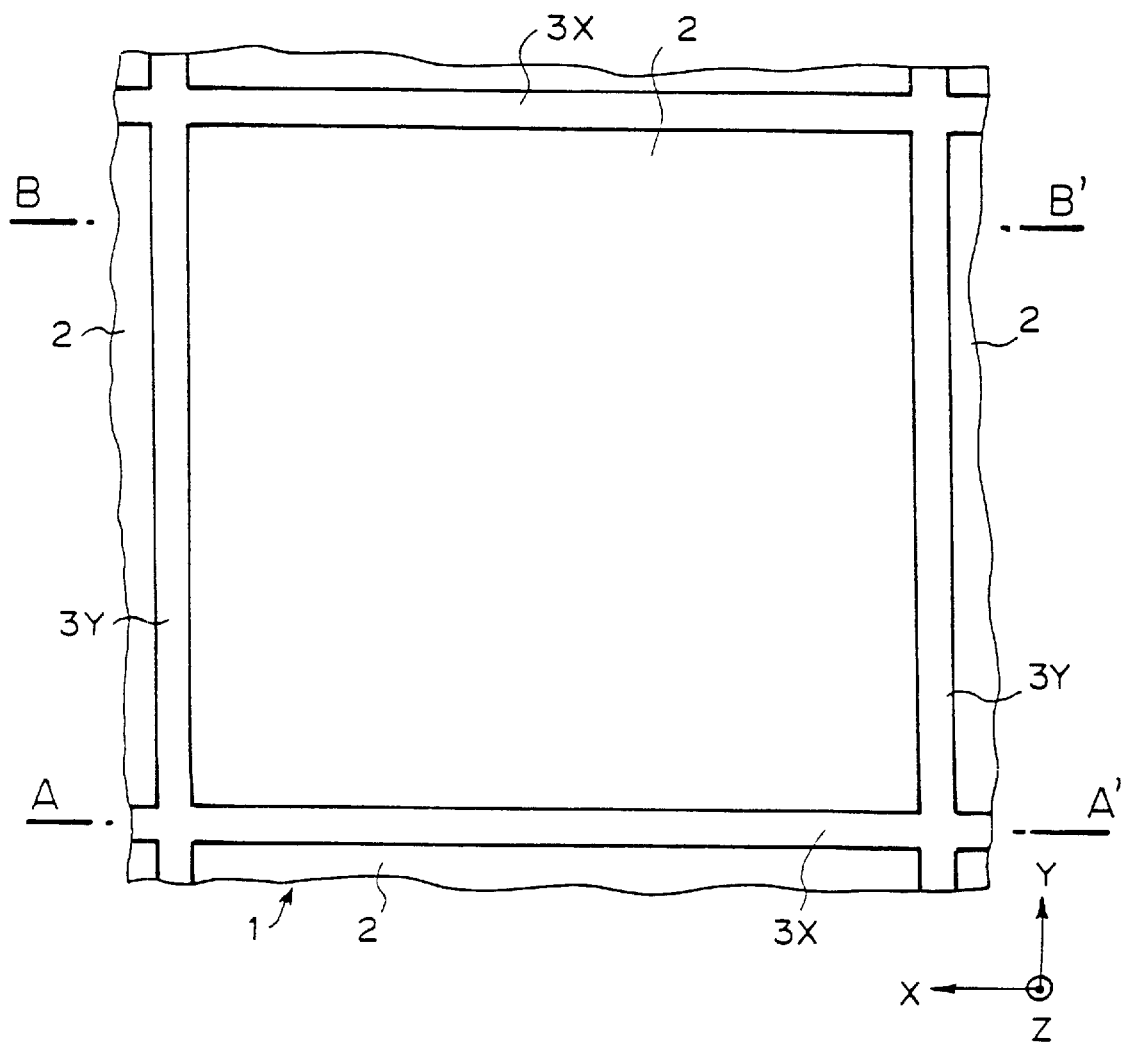
FIG. 3 is a partial plan view of a semiconductor substrate (wafer) according to the present invention.

FIG. 3 is a partial plan view of a semiconductor substrate (wafer) 1. The wafer 1 has a plurality of chip regions or chip areas 2 and a plurality of scribe regions or scribe areas 3X, 3Y. Each chip region 2 is surrounded by two scribe areas 3X and two scribe areas 3Y to be isolated from the other chip regions 2. FIGS. 4A to 10A are cross-sectional views showing an alignment mark forming region of the scribe area 3X, that is, FIGS. 4A to 10A correspond to the cross section taken along line A–A'. FIGS. 4B to 10B are cross-sectional views showing the chip region 2, that is, FIGS. 4B to 10B correspond to the cross section taken along line B–B'. The magnification in the X direction parallel to the substrate surface in FIGS. 4A to 10A are set to be smaller than the magnification in the Z direction vertical to the substrate surface, and the magnifications in the X, Z directions in FIGS. 4B to 10B are set to be equal to each other and set to the same as the magnification in the Z direction of FIGS. 4A to 10A.

Figure 1A:
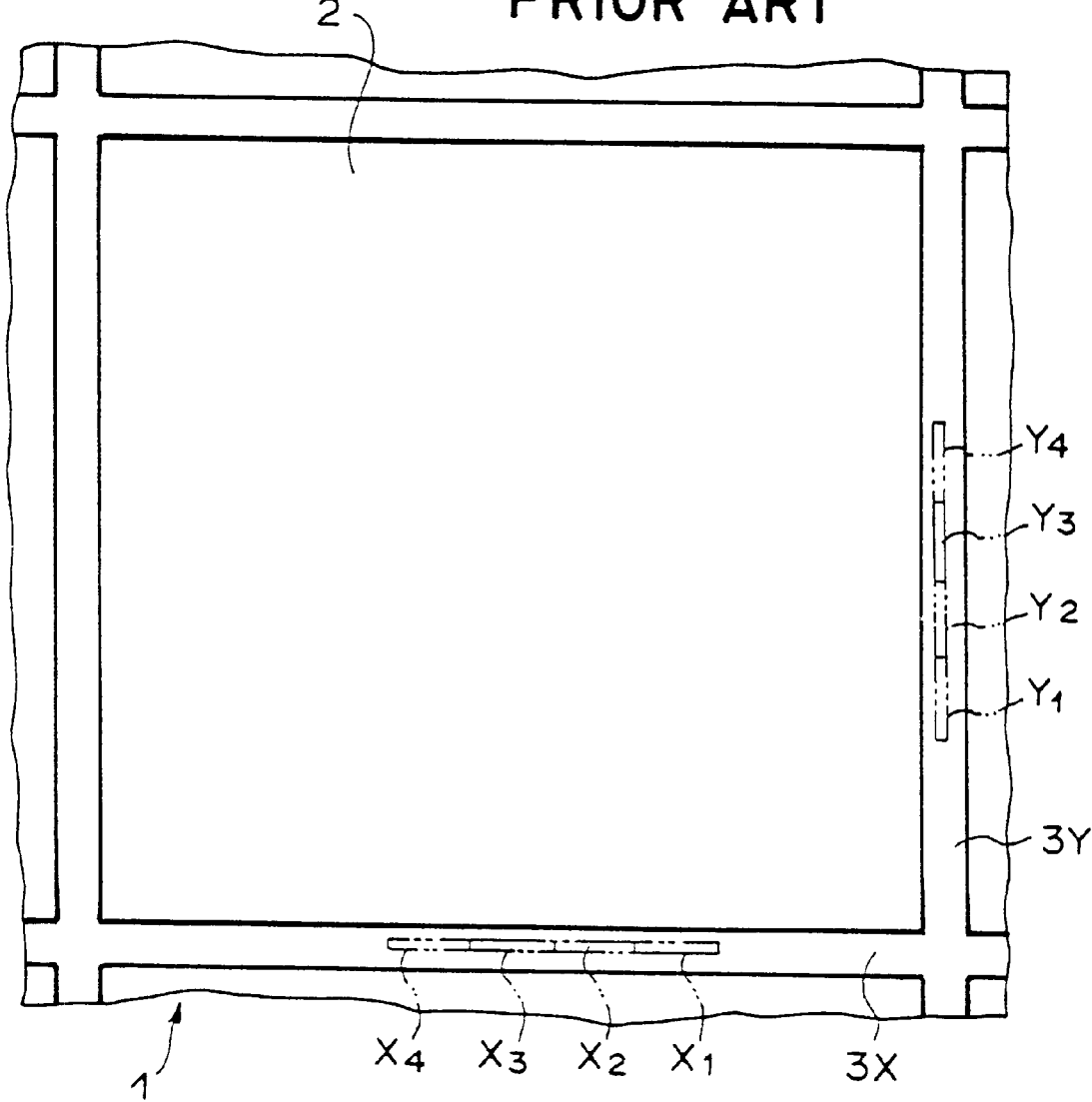
FIG. 1A is a partial plan view of a semiconductor substrate (wafer)
Figure 1B:
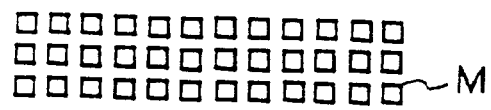
FIG. 1B is an enlarged plan view of an alignment mark.
Figure 2:
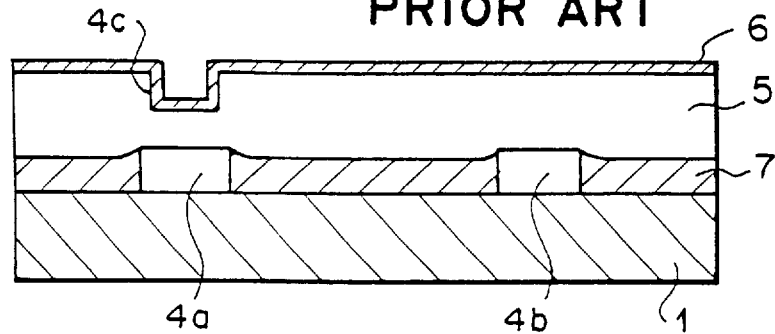
FIG. 2 is a cross-sectional view showing a method of forming a conventional alignment mark.
Figure 4A:
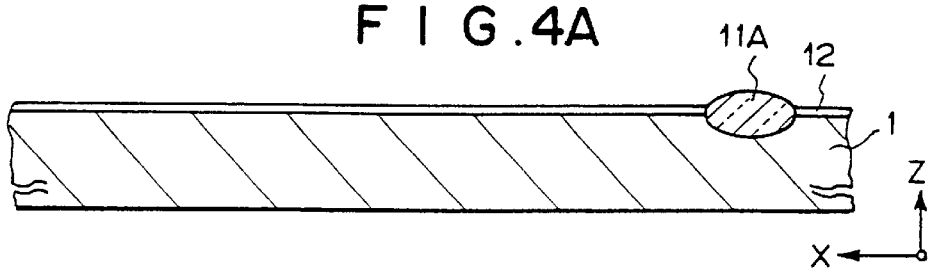
FIGS. 4A and 4B are cross-sectional views showing a scribe area and a chip region according to an embodiment of the present invention respectively.
Figure 4B:
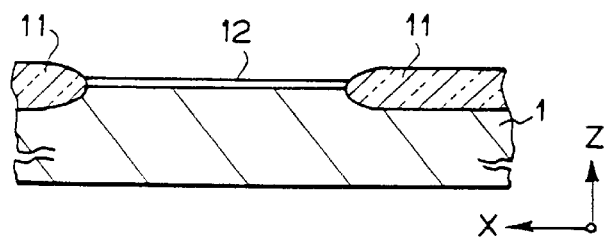

As shown in FIGS. 4A and 4B, the surface portion of the semiconductor substrate (wafer) 1 made of P-type silicon is selectively oxidized so that an active area is isolated by a field oxide film 11 in the chip region and a field alignment mark comprising an assembly of basic marks 11A is formed in the alignment mark forming region. The field alignment mark means an alignment mark formed at the same time as the field oxide film and, here, only one basic mark 11A constituting the field alignment mark is shown, however, actually, plural basic marks 11A are regularly arranged to form the field alignment mark as shown in FIG. 1B. This is also the case as to the other alignment marks described hereunder. Then, a gate oxide film 12 is formed on the wafer 1.

Figure 5A:
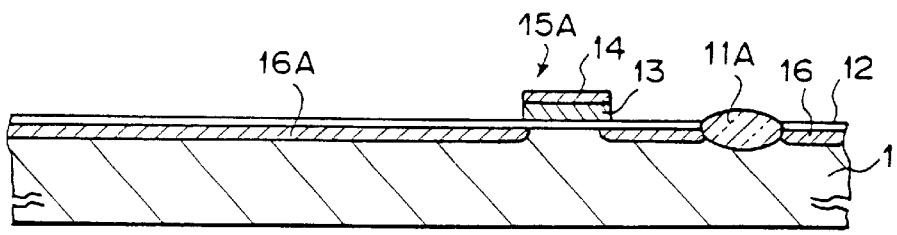
FIGS. 5A and 5B are cross-sectional views showing the scribe area and the chip region respectively.
Figure 5B:
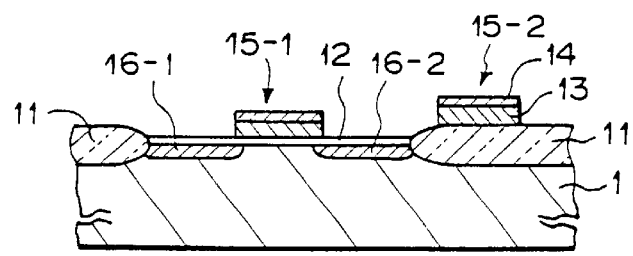

Next, a polysilicon film 13 and a tungsten silicide film 14 are successively deposited and patterned as shown in FIGS. 5A and 5B to form gate electrodes 15-1 and 15-2 (which also serve as word line of DRAM) having the total thickness of 200 nm and a gate alignment mark comprising an assembly of basic marks 15A in the chip region (see FIG. 5B) and the alignment mark forming region (see FIG. 5A), respectively. Subsequently, source/drain regions 16-1 and 16-2 are formed in the chip region. At the same time, an $N^+$-type diffusion layer 16A is formed in the alignment mark forming region.

Figure 6A:
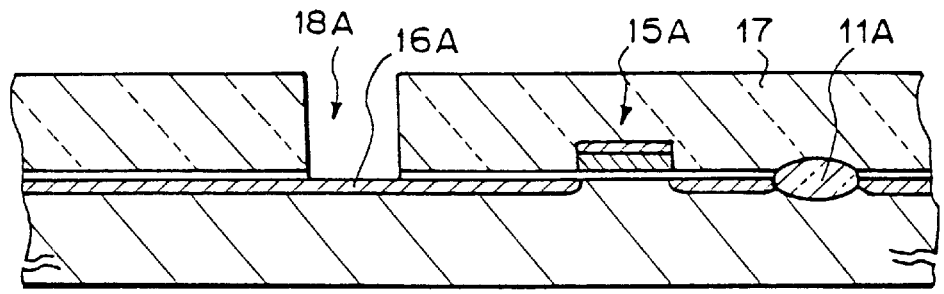
FIGS. 6A and 6B are cross-sectional views showing the scribe area and the chip region.
Figure 6B:
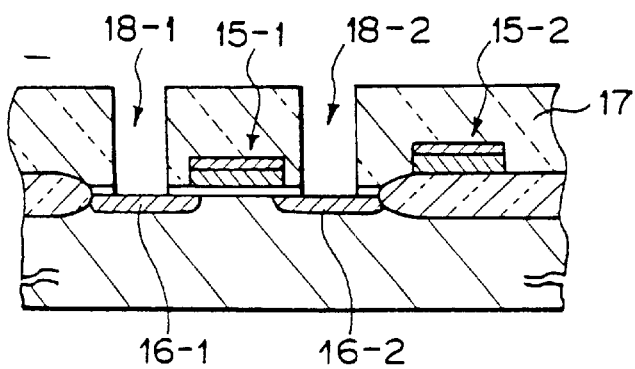

Subsequently, a BPSG film (silicate glass film containing boron and phosphorus) is formed at a thickness of 1 $\mu$m on the entire surface by the CVD method as shown in FIGS. 6A and 6B, and then flattened by CMP (Chemical Mechanical Polishing) to form an interlayer insulating film 17. The interlayer insulating film is transparent. Subsequently, a visual positioning operation is performed on the basis of the gate alignment mark (15A) and then a patterning process is performed to form contact holes 18-1 and 18-2 reaching the source/drain regions 16-1 and 16-2 and a contact alignment mark (interlayer alignment mark) comprising an assembly of basic marks 18A.

Figure 7A:
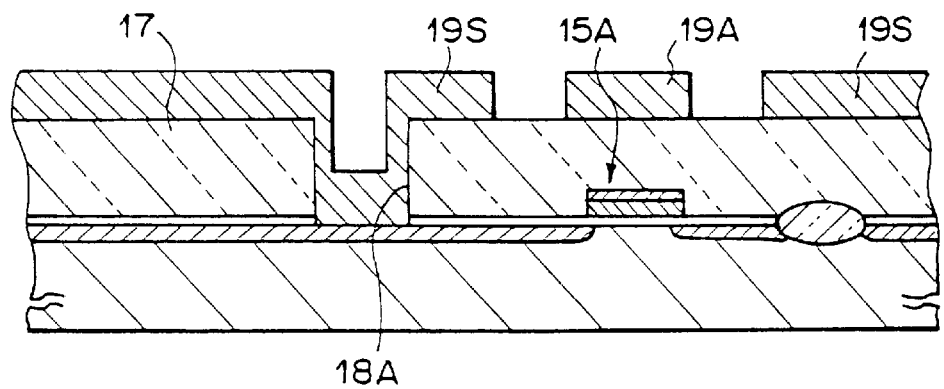
FIGS. 7A and 7B are cross-sectional views showing the scribe area and the chip region.
Figure 7B:
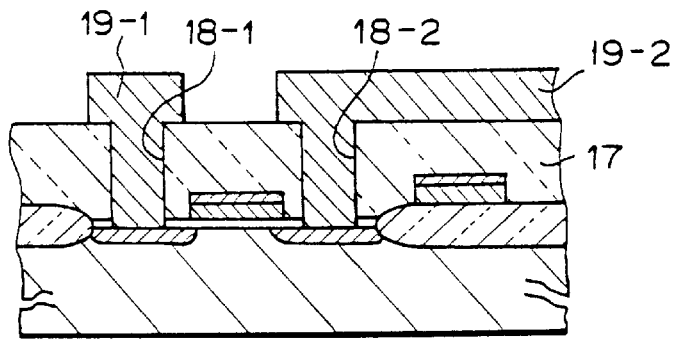

Thereafter, an Al-Si-Cu alloy film, for example, is deposited at a thickness of 500 nm by the sputtering method as shown in FIGS. 7A and 7B, and the visual positioning operation is performed on the basis of the contact alignment mark (18A). For example, in the case of 0.5 $\mu$m rule, the basic marks 11A, 15A, 18A, etc. are formed at a size of 2 to 5 $\mu$m, and thus the contact alignment mark 18A does not lose the function as the alignment mark even when the Al-Si-Cu alloy film is deposited. Thereafter, the patterning process is performed to form wires 19-1 and 19-2 of a first layer and a first wiring alignment mark comprising an assembly of basic marks 19A. The basic marks 19A of the first wiring alignment mark are formed above the basic marks 15A of the gate alignment mark. The basic marks 19A are set to be larger in size than the basic marks 15A by at least an amount enough for the positioning. For example, when the basic mark 15A is a square whose one side length is equal to 2 $\mu$m, the basic mark 19A is designed as a square whose one side length is equal to (2+2$\alpha$) $\mu$m ($\alpha$ represents a surplus amount enough for the positioning). In this case, $\alpha$ is set to about 0.2 $\mu$m. With this dimensional setting, the gate alignment mark is optically shielded by the first wiring alignment mark, and thus it will be unseen in the subsequent visual positioning operation. In this case, a shield film 19S is formed around the first wiring alignment mark so as to be away from the first wiring alignment mark at a predetermined distance (for example, the distance between the basic marks (for example, 10 $\mu$m)) at the time when the first wiring alignment mark is formed so that the alignment marks formed in the previous steps, such as the field alignment mark, etc., are shielded. It is needless to say that the contact alignment mark does not lose its function as the alignment mark even when it is shielded. Further, it is preferable that the shield film 19S is not formed over the entire scribe area, and the occupation area of the shield film 19S is set to be as small as possible to the extent that all the alignment marks formed until the previous steps are sufficiently shielded by the shield film 19S. This is because scattering of conductive materials is prevented or suppressed as much as possible when the semiconductor substrate is scribed and divided into pellets or chips.

Figure 8A:
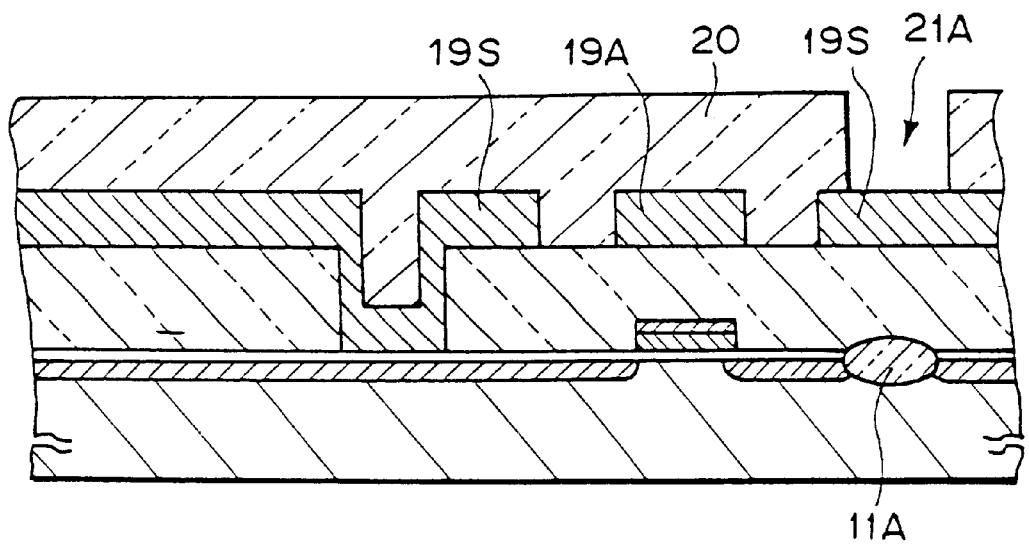
FIGS. 8A and 8B are cross-sectional views showing the scribe area and the chip region respectively.
Figure 8B:
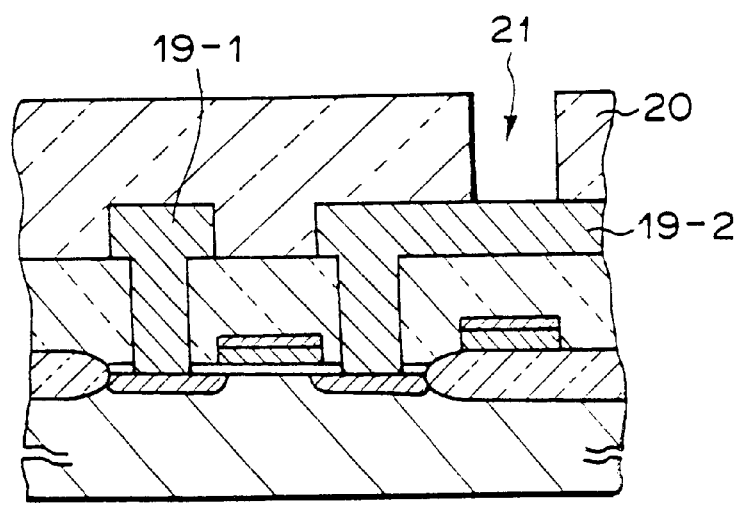

Subsequently, as shown in FIGS. 8A and 8B, an interlayer insulating film 20 which is flattened by the CMP method is formed, and it is subjected to the visual positioning operation on the basis of the first wiring alignment mark (19A) and patterned to form a contact hole 21 on the wire 19-2. At the same time, a contact alignment mark (interlayer alignment mark) comprising an assembly of basic marks 21A on the shield film 19S above the field alignment mark (11A) is formed. The dimension of the basic mark 21A may be set independently from the basic mark 11A.

Subsequently, as shown in FIGS. 9A and 9B, an opaque film such as Al-Si-Cu alloy film or the like is formed, and then subjected to the visual positioning operation on the basis of the contact alignment mark (21A) and patterned to form a second wire 22, a second wiring alignment mark comprising an assembly of basic marks 22A and a shield film 22S. Each basic mark 22A is formed at a size enough for the visual positioning above the contact alignment mark (18A), and the shield film 22S is away from the second wiring alignment mark (22A) at a predetermined distance (for example, 10 $\mu$m).

Figure 10A:
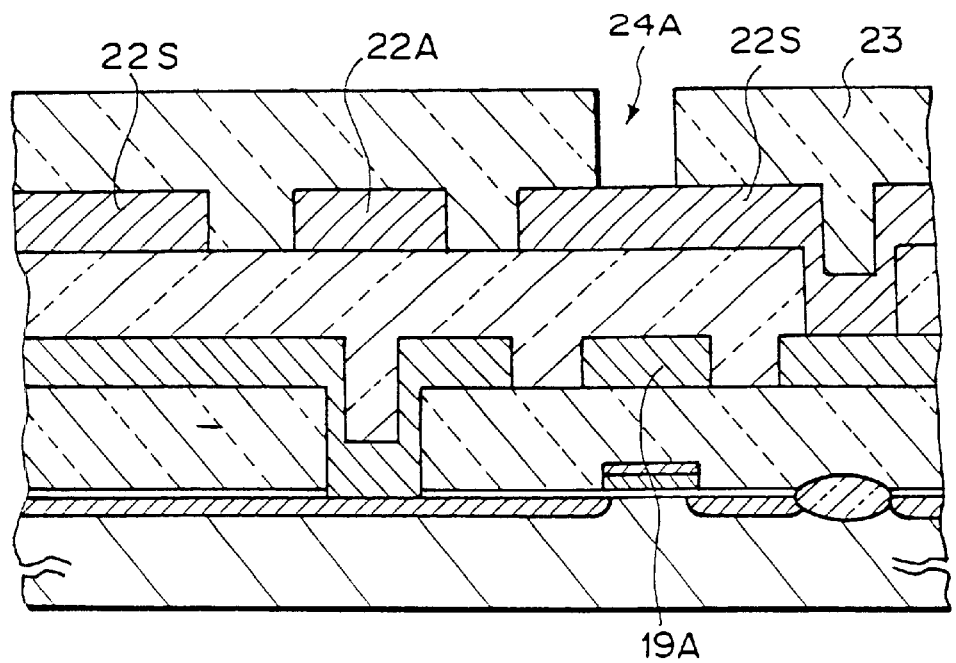
FIGS. 10A and 10B are cross-sectional views showing the scribe area and the chip region.
Figure 10B:
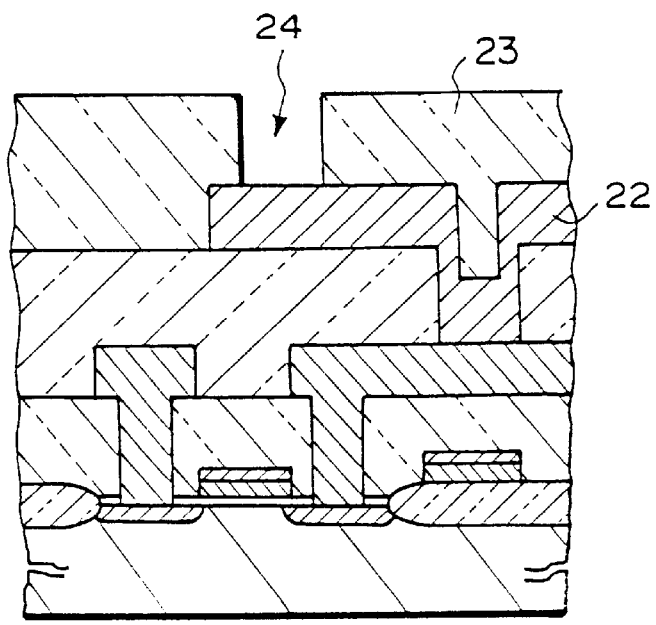

Subsequently, as shown in FIGS. 10A and 10B, an interlayer insulating film 23 which is flattened by the CMP method is formed, and then subjected to the visual positioning operation on the basis of the second wiring alignment (22A) and patterned to form a contact hole 24 and a contact alignment mark comprising an assembly of basic marks 24A. Each basic mark 24A is formed above the first wiring alignment mark (19A), and the dimension of the basic mark 24A may be set independently. Subsequently, desired steps containing a step of forming a third wire, etc. are performed.

The formation of the semiconductor substrate (wafer) in which electrical circuits are made is finished through the above steps. Subsequently, the semiconductor substrate is divided at the scribe regions to form a plurality of semiconductor chips or semiconductor device which each correspond to the chip region. Each semiconductor chip is then subjected to a mount process, etc.

In the above-described process, each alignment mark is also arranged on the other scribe area 3Y.

In the above embodiment, the contact alignment mark is formed in the interlayer insulating film on the semiconductor substrate on the basis of the opaque alignment mark at the lower side and, then the interlayer insulating film is selectively covered to form an opaque alignment mark and a shield film thereon, whereby all the alignment marks at the lower side other than the contact alignment mark are optically unrecognizable. Accordingly, the alignment marks can be formed while stacked in the thickness direction (Z direction) of the semiconductor substrate. A plurality of layers each bearing the alignment mark may be stacked, and thus the occupation area of the alignment marks can be further reduced. Therefore, the saving of resources and the reduction in cost of semiconductor devices on the basis of the effective use of wafers can be achieved.

As mentioned in the above embodiment, there can be a plurality of pairs of the first alignment mark and the second alignment mark.

Further, the contact alignment mark is formed as a hole like the contact hole. Conversely, the interlayer insulating film may be left in a convex form to obtain the contact alignment mark. The gate alignment mark and the wiring alignment mark are formed by selectively leaving the conductive film as in the case of the gate electrode and the wires. Conversely, an opening may be provided in the conductive film to form the gate alignment mark and the wiring alignment mark. In this case, the opening must be formed at a suitable position so that any alignment mark formed in the previous steps is not located below the opening. As described above, the alignment mark may be in any one of positive relationship or negative relationship with the pattern of the chip region. At any rate, it is sufficient that the alignment marks which have been formed can be shielded by an opaque film.

what is claimed is:

1. A semiconductor device manufacturing method, in which a semiconductor device is manufactured in a chip region of a semiconductor substrate having a scribe area for isolating said chip region, comprising the steps of:

forming a first alignment mark in said scribe area;

forming a first interlayer insulating film on said first alignment mark;

forming an interlayer alignment mark by patterning the first interlayer insulating film; and depositing and patterning a conductive opaque film to form a second alignment mark having a size greater than that of said first alignment mark and shielding the first alignment mark.

2. The semiconductor device manufacturing method as claimed in claim 1, further comprising a step of planarizing a surface of the first interlayer insulating film.

3. A semiconductor device manufacturing method, in which a semiconductor device is manufactured in a chip region of a semiconductor substrate having a scribe area for isolating said chip region, comprising the steps of:

forming a first alignment mark in said scribe area;

forming a first interlayer insulating film;

forming an interlayer alignment mark by patterning the first interlayer insulating film;

depositing and patterning a conductive opaque film to form a second alignment mark shielding the first alignment mark; and forming a shield film of the conductive opaque film so as to be away from the second alignment mark at a predetermined distance.

4. The semiconductor device manufacturing method as claimed in claim 3, further comprising a step of forming a second interlayer insulating film so as to cover the second alignment mark, and selectively removing the second interlayer insulating film to form a third alignment mark on said shield film.

5. The semiconductor device manufacturing method as claimed in claim 4, further comprising a step of planarizing a surface of said second interlayer insulating film.

6. A semiconductor device manufacturing method, in which a semiconductor device is manufactured in a chip region of a semiconductor substrate having a scribe area for isolating said chip region, comprising the steps of:

forming a first alignment mark in said scribe area;

forming a first interlayer insulating film;

forming an interlayer alignment mark by patterning the first interlayer insulating film; and depositing and patterning a conductive opaque film to form a second alignment mark shielding the first alignment mark;

wherein the first alignment mark is formed by regularly arranging plural first basic marks, and second basic marks each of which is larger in size than each first basic mark by at least an amount enough for positioning are arranged one by one above each first basic mark to form the second alignment mark.

* * * * *